US012777906B2

(12) United States Patent
Ho

(10) Patent No.: US 12,777,906 B2
(45) Date of Patent: Oct. 27, 2026

(54) METHOD OF MANUFACTURING SEMICONDUCTOR DEVICE

(71) Applicant: NANYA TECHNOLOGY CORPORATION, New Taipei City (TW)

(72) Inventor: Jui Wen Ho, New Taipei City (TW)

(73) Assignee: NANYA TECHNOLOGY CORPORATION, New Taipei City (TW)

(*) Notice: Subject to any disclaimer, the term of this patent is extended or adjusted under 35 U.S.C. 154(b) by 354 days.

(21) Appl. No.: 18/738,057

(22) Filed: Jun. 9, 2024

(65) Prior Publication Data

US 2025/0379098 A1 Dec. 11, 2025

(51) Int. Cl.

*H10W 20/00* (2026.01)
*H10B 12/00* (2023.01)
*H10P 50/00* (2026.01)
*H10P 52/40* (2026.01)

(52) U.S. Cl.

CPC .......... *H10W 20/081* (2026.01); *H10B 12/01* (2023.02); *H10P 50/71* (2026.01); *H10P 52/403* (2026.01); *H10W 20/062* (2026.01)

(58) Field of Classification Search

CPC .. H10W 20/081; H10W 20/062; H10B 12/01; H10B 12/482; H10P 50/71; H10P 52/403

See application file for complete search history.

(56) References Cited

U.S. PATENT DOCUMENTS

| | | | | |
|---|---|---|---|---|
| 11,610,611 | B2 * | 3/2023 | Ke | G11C 5/063 |
| 11,641,731 | B2 * | 5/2023 | Lee | H10B 12/0335 257/532 |
| 12,133,376 | B2 * | 10/2024 | Rao | H10B 12/485 |
| 2009/0053873 | A1 * | 2/2009 | Tsai | H10B 41/30 438/424 |
| 2012/0100705 | A1 * | 4/2012 | Xiao | H10B 12/488 438/586 |
| 2017/0025354 | A1 * | 1/2017 | Watanabe | H10B 41/35 |
| 2018/0190662 | A1 * | 7/2018 | Wu | H10B 12/053 |
| 2020/0111795 | A1 * | 4/2020 | Feng | H10B 12/0335 |

* cited by examiner

*Primary Examiner* — S M Sohel Imtiaz

(74) *Attorney, Agent, or Firm* — CKC & Partners Co., LLC

(57) ABSTRACT

The present disclosure provides a method of manufacturing a semiconductor device. The method includes: providing a semiconductor structure, in which the semiconductor structure includes nitride portions wrapping a nitride layer and an oxide layer, a contact layer between the nitride portions, a spacer layer disposed on the nitride portions, and a patterned hardmask layer on the spacer layer; forming a filling material on the contact layer and covering the nitride portions, the spacer layer, and the patterned hardmask layer; removing portions of the filling material, the contact layer, the nitride layer, the nitride layer, and the oxide layer; conformally forming a blanket layer on the filling material, the contact layer, and the remaining portions of the nitride portions, the nitride layer, and the oxide layer; overfilling a conductive layer on the blanket layer; planarizing the conductive layer; and forming a trench.

20 Claims, 8 Drawing Sheets

METHOD OF MANUFACTURING SEMICONDUCTOR DEVICE

BACKGROUND

Field of Invention

The present disclosure relates to a method of manufacturing a semiconductor device.

Description of Related Art

With the evolution of generations of semiconductor processes, there will be challenges of a semiconductor structure in a memory device. One of the related challenges is that the parasitic capacitance of the semiconductor device will be increased if air gaps are not encapsulated in a proper manner (for instance, the air gaps are filled) during an air gap encapsulation process. The other one of the related challenges is that defects may occur during the process of filling the trench located over the air gaps if the trench is not filled in a proper manner. The defects are likely to cause resistance variation and a decrease in the breakdown voltage in subsequent related processes, thereby reducing the performance of the entire semiconductor device.

SUMMARY

In view of this, one purpose of present disclosure is to provide a method of manufacturing a semiconductor device that can solve the aforementioned problems.

In order to achieve the above objective, according to an embodiment of the present disclosure, a method of manufacturing a semiconductor device includes: providing a semiconductor structure, in which the semiconductor structure includes nitride portions wrapping a nitride layer and an oxide layer, a contact layer between the nitride portions, a spacer layer disposed on the nitride portions, and a patterned hardmask layer on the spacer layer; forming a filling material on the contact layer and covering the nitride portions, the spacer layer, and the patterned hardmask layer; removing portions of the filling material, the contact layer, the nitride portions, the nitride layer, and the oxide layer, in which a top surface of remaining portions of the nitride portions, the nitride layer, and the oxide layer has a rounding shape; conformally forming a blanket layer on the filling material, the contact layer, and the remaining portions of the nitride portions, the nitride layer, and the oxide layer; overfilling a conductive layer on the blanket layer; planarizing the conductive layer so that a top surface of the conductive layer is leveled with an uppermost surface of the patterned hardmask layer; and forming a trench to remove portions of the conductive layer, the blanket layer, the nitride portions, the nitride layer, and the oxide layer.

In one or more embodiments of the present disclosure, each of the nitride portions wrapping the nitride layer and the oxide layer, the nitride layer, and the oxide layer form a bit line structure.

In one or more embodiments of the present disclosure, forming the filling material on the contact layer and covering the nitride portions, the spacer layer, and the patterned hardmask layer is performed such that a top surface of the filling material is higher than the uppermost surface of the patterned hardmask layer.

In one or more embodiments of the present disclosure, removing the portions of the filling material, the contact layer, the nitride portions, the nitride layer, and the oxide layer is performed such that a top surface of the filling material is coplanar with the uppermost surface of the patterned hardmask layer.

In one or more embodiments of the present disclosure, removing the portions of the filling material, the contact layer, the nitride portions, the nitride layer, and the oxide layer is performed such that a remaining portion of the filling material is not over the patterned hardmask layer.

In one or more embodiments of the present disclosure, removing the portions of the filling material, the contact layer, the nitride portions, the nitride layer, and the oxide layer is performed such that a top surface of the contact layer is lower than the top surface of the remaining portions of the nitride portions, the nitride layer, and the oxide layer.

In one or more embodiments of the present disclosure, at least a portion of the blanket layer conforms to the top surface of the remaining portions of the nitride portions, the nitride layer, and the oxide layer.

In one or more embodiments of the present disclosure, overfilling the conductive layer on the blanket layer is performed such that the conductive layer covers the spacer layer and the patterned hardmask layer.

In one or more embodiments of the present disclosure, planarizing the conductive layer is performed such that a portion of the blanket layer over the spacer layer and the patterned hardmask layer is removed.

In one or more embodiments of the present disclosure, forming the trench to remove the portions of the conductive layer, the blanket layer, the nitride portions, the nitride layer, and the oxide layer is performed such that a part of a top portion of the blanket layer, the nitride portions, the nitride layer, and the oxide layer is removed.

In order to achieve the above objective, according to an embodiment of the present disclosure, a method of manufacturing a semiconductor device includes: providing a semiconductor structure, in which the semiconductor structure includes nitride portions wrapping a nitride layer and an oxide layer, a contact layer between the nitride portions, a spacer layer disposed on the nitride portions, and a patterned hardmask layer on the spacer layer; forming a filling material on the contact layer and covering the nitride portions, the spacer layer, and the patterned hardmask layer; removing portions of the filling material, the contact layer, the nitride portions, the nitride layer, and the oxide layer, in which a top surface of remaining portions of the nitride portions, the nitride layer, and the oxide layer has a rounding shape; conformally forming a blanket layer on the filling material, the contact layer, and the remaining portions of the nitride portions, the nitride layer, and the oxide layer; overfilling a conductive layer on the blanket layer; planarizing the conductive layer and stopped by the patterned hardmask layer; and forming a trench to remove portions of the conductive layer, the blanket layer, the nitride portions, the nitride layer, and the oxide layer.

In one or more embodiments of the present disclosure, each of the nitride portions wrapping the nitride layer and the oxide layer, the nitride layer, and the oxide layer form a bit line structure.

In one or more embodiments of the present disclosure, forming the filling material on the contact layer and covering the nitride portions, the spacer layer, and the patterned hardmask layer is performed such that a top surface of the filling material is higher than an uppermost surface of the patterned hardmask layer.

In one or more embodiments of the present disclosure, removing the portions of the filling material, the contact layer, the nitride portions, the nitride layer, and the oxide layer is performed such that a top surface of the filling material is coplanar with an uppermost surface of the patterned hardmask layer.

In one or more embodiments of the present disclosure, removing the portions of the filling material, the contact layer, the nitride portions, the nitride layer, and the oxide layer is performed such that a remaining portion of the filling material is not over the patterned hardmask layer.

In one or more embodiments of the present disclosure, removing the portions of the filling material, the contact layer, the nitride portions, the nitride layer, and the oxide layer is performed such that a top surface of the contact layer is lower than the top surface of the remaining portions of the nitride portions, the nitride layer, and the oxide layer.

In one or more embodiments of the present disclosure, at least a portion of the blanket layer conforms to the top surface of the remaining portions of the nitride portions, the nitride layer, and the oxide layer.

In one or more embodiments of the present disclosure, overfilling the conductive layer on the blanket layer is performed such that the conductive layer covers the spacer layer and the patterned hardmask layer.

In one or more embodiments of the present disclosure, planarizing the conductive layer and stopped by the patterned hardmask layer is performed such that a portion of the blanket layer over the spacer layer and the patterned hardmask layer is removed.

In one or more embodiments of the present disclosure, forming the trench to remove the portions of the conductive layer, the blanket layer, the nitride portions, the nitride layer, and the oxide layer is performed such that a part of a top portion of the blanket layer, the nitride portions, the nitride layer, and the oxide layer is removed.

In summary, in the method of manufacturing the semiconductor device of the present disclosure, since the patterned hardmask layer is provided before the step of forming the filling material on the contact layer and covering the nitride portions, the spacer layer, and the patterned hardmask layer, the semiconductor device can be formed without damaging the rounding shape of the top surface of the remaining portions of the nitride portions, the nitride layer, and the oxide layer, thereby reducing the quantity of masks to form the conductive material. In the method of manufacturing the semiconductor device of the present disclosure, since the top surface of the filling material is higher than the uppermost surface of the patterned hardmask layer in the step of forming the filling material on the contact layer and covering the nitride portions, the spacer layer, and the patterned hardmask layer, the rounding shape of the top surface of the remaining portions of the nitride portions, the nitride layer, and the oxide layer can be formed, thereby defining a bottom portion of the conductive portion with enlarged volume. The method of manufacturing the semiconductor device improves the overall electrical performance of the entire semiconductor device.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
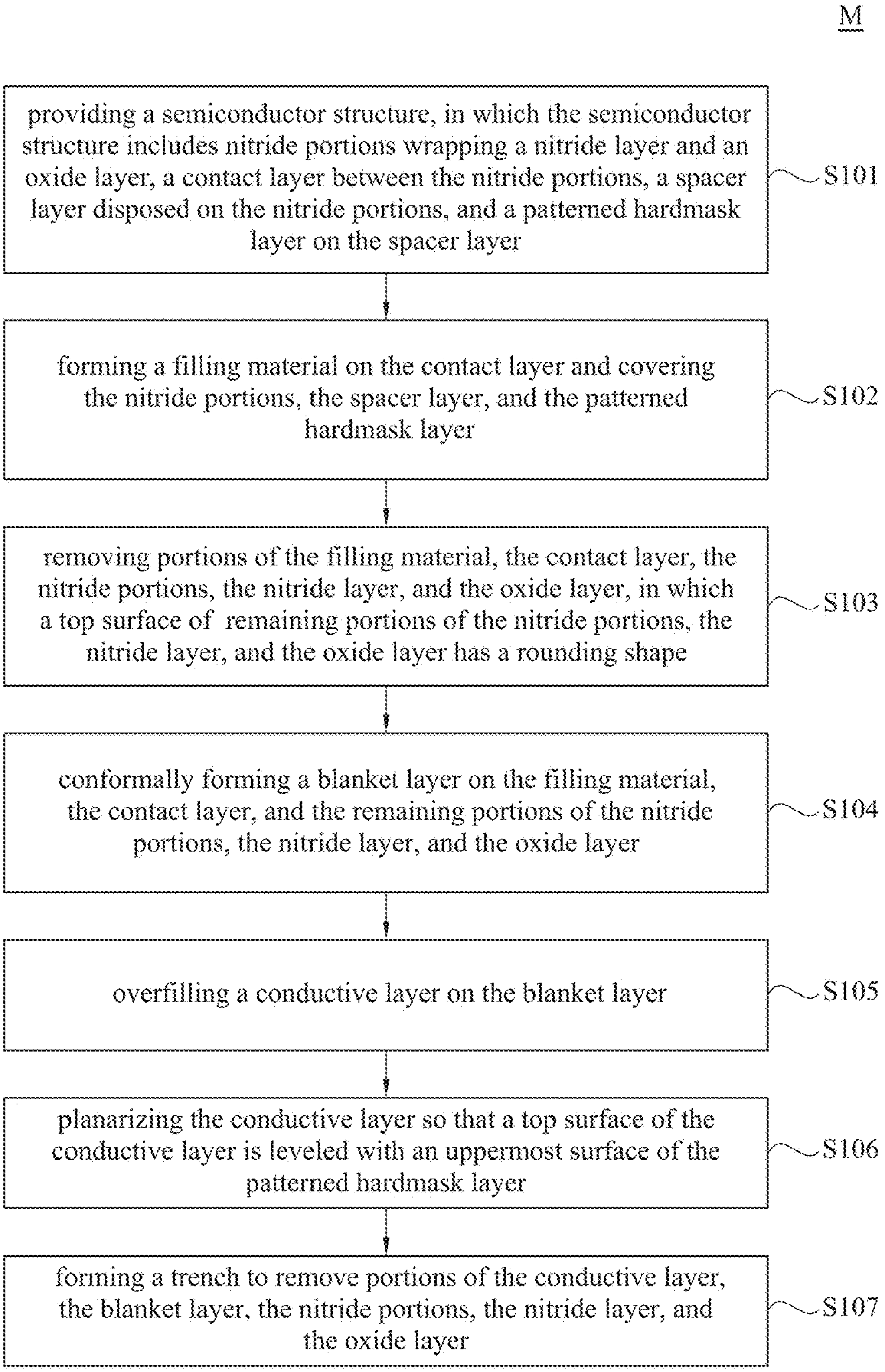
FIG. 1 is a flow chart of a method of manufacturing a semiconductor device as shown in FIG. 8 in accordance with an embodiment of present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Reference is made to FIG. 1. FIG. 1 is a flow chart of a method M of manufacturing a semiconductor device 100 as shown in FIG. 8 in accordance with an embodiment of present disclosure. The method M shown in FIG. 1 includes a step S101, a step S102, a step S103, a step S104, a step S105, a step S106, and a step S107. Please refer to FIG. 1 and FIG. 2 for better understanding the step S101, refer to FIG. 1 and FIG. 3 for better understanding the step S102, refer to FIG. 1 and FIG. 4 for better understanding the step S103, refer to FIG. 1 and FIG. 5 for better understanding the step S104, refer to FIG. 1 and FIG. 6 for better understanding the step S105, refer to FIG. 1 and FIG. 7 for better understanding the step S106, and refer to FIG. 1 and FIG. 8 for better understanding the step S107.

Step S101, step S102, step S103, step S104, step S105, step S106, and step S107 are described in detail below. It is noted that the elements disposed in back side and being shielded are depicted by a dotted line. In addition, the elements which are cross-sectioned are depicted by shading.

Figure 2:
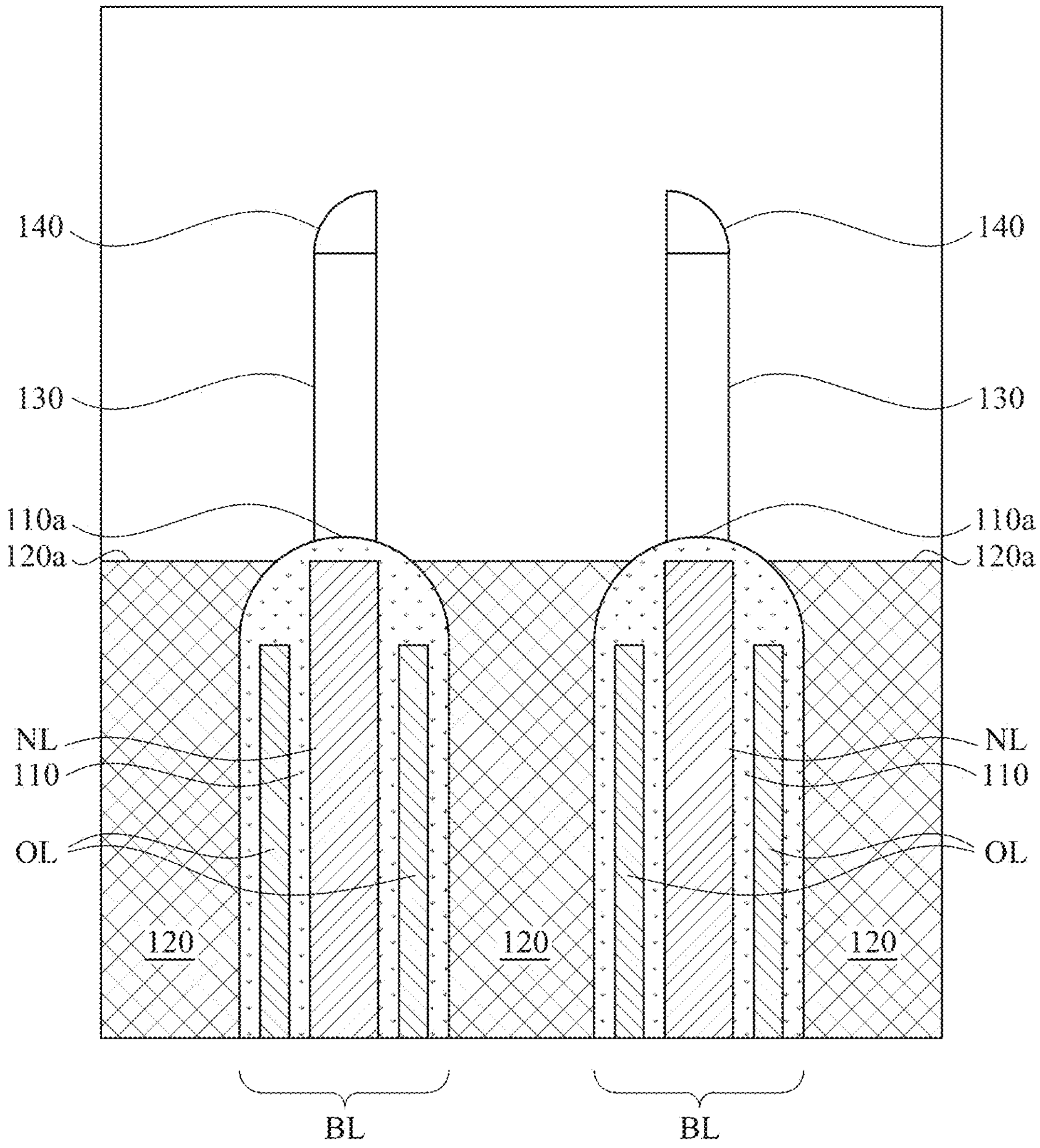
FIG. 2 is a cross-sectional view of an intermediate stage of manufacturing a semiconductor device in accordance with an embodiment of present disclosure.

In step S101, a semiconductor structure is provided, as shown in FIG. 2.

Reference is made to FIG. 2. FIG. 2 is a cross-sectional view of an intermediate stage of manufacturing the semiconductor device 100 as shown in FIG. 8 in accordance with an embodiment of present disclosure. As shown in FIG. 2, in this embodiment, the semiconductor structure includes a plurality of nitride portions 110, a nitride layer NL, an oxide layer OL, a contact layer 120, a spacer layer 130, and a patterned hardmask layer 140. The nitride portions 110 wrap the nitride layer NL and the oxide layer OL. The nitride layer NL is separated from the oxide layer OL. The contact layer 120 is disposed between the nitride portions 110. More specifically, the contact layer 120 is disposed between every two adjacent nitride portions 110. The spacer layer 130 is disposed on the nitride portions 110. The patterned hardmask layer 140 is disposed on the spacer layer 130. More specifically, the spacer layer 130 is patterned by the patterned hardmask layer 140, so that each of the portions of the patterned spacer layer 130 is disposed on the top surface 110*a* of each of the nitride portions 110.

In some embodiments, the nitride layer NL, the oxide layer OL, and each of the nitride portion 110 form a bit line structure BL.

In some embodiments, the oxide layer OL laterally surrounds the nitride layer NL in each of the nitride portions 110.

In some embodiments, each of the nitride portions 110 has a top surface 110*a* and the contact layer 120 has a top surface 120*a*. As shown in FIG. 2, in some embodiments, the top surface 120*a* of the contact layer 120 is lower than the top surface 110*a* of each of the nitride portions 110.

In some embodiments, each of the nitride portions 110 is elongated in a bottom-up direction, as shown in FIG. 2.

In some embodiments, the top surface 110*a* of each of the nitride portions 110 has a rounding shape.

In some embodiments, the nitride portions 110 may be composed of nitride. In some embodiments, the nitride portions 110 may include a material, such as titanium nitride (TiN), silicon nitride ($Si_xN_y$), or the like. However, any suitable material may be utilized.

In some embodiments, the nitride portions 110 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the nitride portions 110.

In some embodiments, the nitride layer NL may be composed of nitride. In some embodiments, the nitride layer NL may include a material, such as titanium nitride (TiN), silicon nitride ($Si_xN_y$), or the like. However, any suitable material may be utilized.

In some embodiments, the nitride layer NL may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the nitride layer NL.

In some embodiments, the oxide layer OL may be composed of oxide. In some embodiments, the oxide layer OL may include a material, such as silicon oxide ($SiO_2$), or the like. However, any suitable material may be utilized.

In some embodiments, the oxide layer OL may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the oxide layer OL.

In some embodiments, the contact layer 120 may include a material, such as polysilicon, or the like. However, any suitable material may be utilized.

In some embodiments, the contact layer 120 may be ohmic contact. In some embodiments, the contact layer 120 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the contact layer 120.

In some embodiments, the spacer layer 130 may be composed of dielectric. In some embodiments, the spacer layer 130 may include a material, such as titanium nitride (TiN), silicon nitride ($SiO_2$), or the like. However, any suitable material may be utilized.

In some embodiments, the spacer layer 130 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the spacer layer 130.

In some embodiments, the patterned hardmask layer 140 may be configured as an etch stop layer. In some embodiments, the patterned hardmask layer 140 may include a material, such as organic compound, carbon, doped carbon, oxide, or the like. However, any suitable material may be utilized.

In some embodiments, the patterned hardmask layer 140 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the patterned hardmask layer 140.

Figure 3:
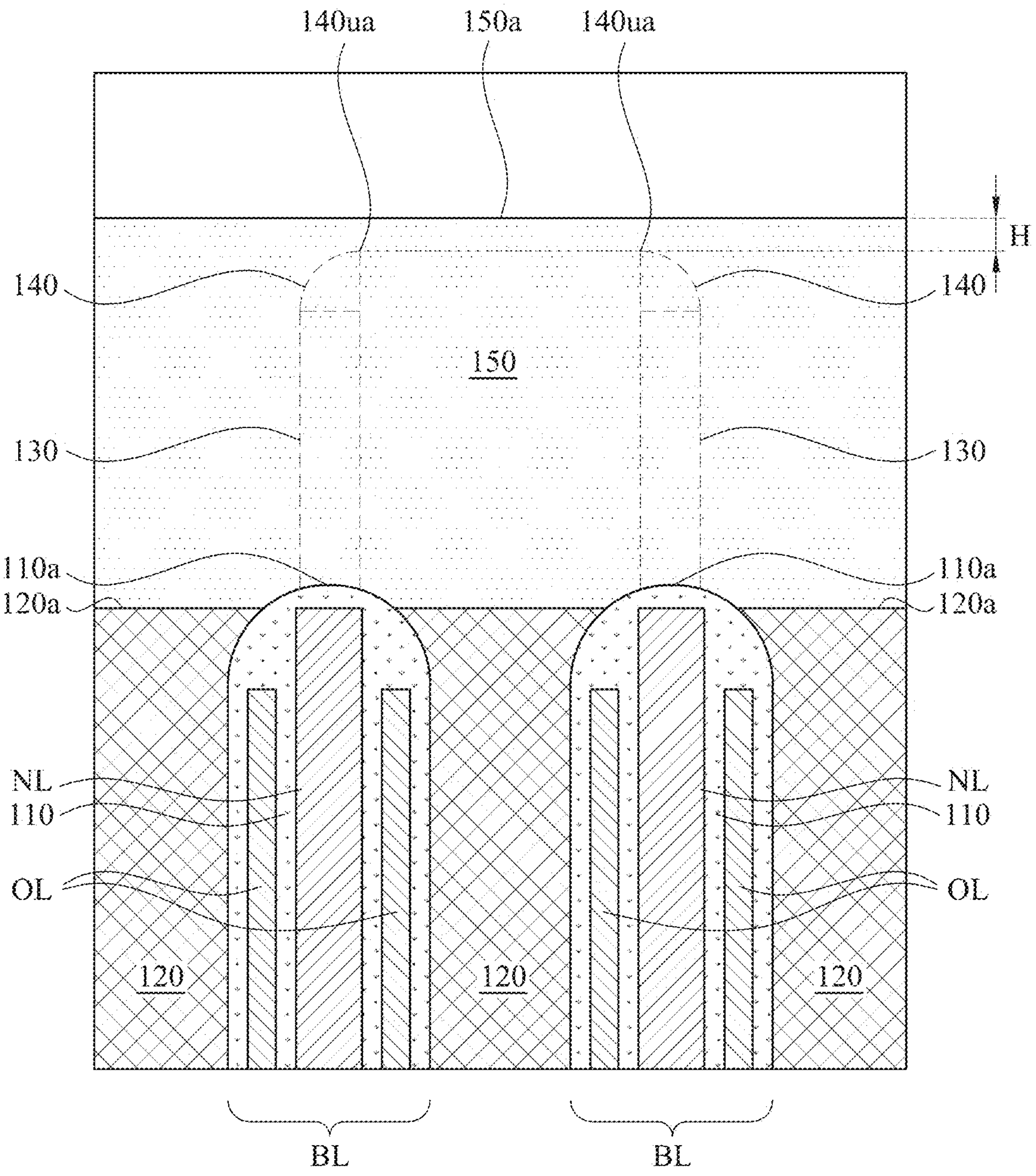
FIG. 3 is a cross-sectional view of an intermediate stage of manufacturing the semiconductor device in accordance with an embodiment of present disclosure.

In step S102, a filling material 150 is formed, as shown in FIG. 3.

Reference is made to FIG. 3. FIG. 3 is a cross-sectional view of an intermediate stage of manufacturing the semiconductor device 100 in accordance with an embodiment of present disclosure. As shown in FIG. 3, in this embodiment, the filling material 150 is formed on the contact layer 120 and covers the nitride portions 110, the spacer layer 130, and the patterned hardmask layer 140. In other words, the filling material 150 is deposited such that the bit line structure BL, the contact layer 120, the spacer layer 130, and the patterned hardmask layer 140 are not exposed. More specifically, the spacer layer 130 and the patterned hardmask layer 140 are located in the back side and are not cross-sectioned, so that the filling material 150 is deposited on the bit line structure BL and the contact layer 120 in the front side and deposited over the spacer layer 130 and the patterned hardmask layer 140 in the back side.

As shown in FIG. 3, in some embodiments, the filling material 150 has a top surface 150*a* and the patterned hardmask layer 140 has an uppermost surface 140*ua*. In some embodiments, forming the filling material 150 on the contact layer 120 and covering the nitride portions 110, the spacer layer 130, and the patterned hardmask layer 140 is performed such that the top surface 150*a* of the filling material 150 is higher than the uppermost surface 140*ua* of the patterned hardmask layer 140.

As shown in FIG. 3, in some embodiments, forming the filling material 150 on the contact layer 120 and covering the nitride portions 110, the spacer layer 130, and the patterned hardmask layer 140 is performed such that the top surface 150*a* of the filling material 150 is higher than the uppermost surface 140*ua* of the patterned hardmask layer 140 by a height H. In some embodiments, the height H is preferably about 10 nanometers. However, the present disclosure is not intended to limit the range of the height H.

In some embodiments, the filling material 150 may be composed of metallic material. In some embodiments, the filling material 150 may include a material, such as silicon nitride ($Si_xN_y$), titanium nitride (TiN), or the like. However, any suitable material may be utilized.

In some embodiments, the filling material 150 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the filling material 150.

Figure 4:
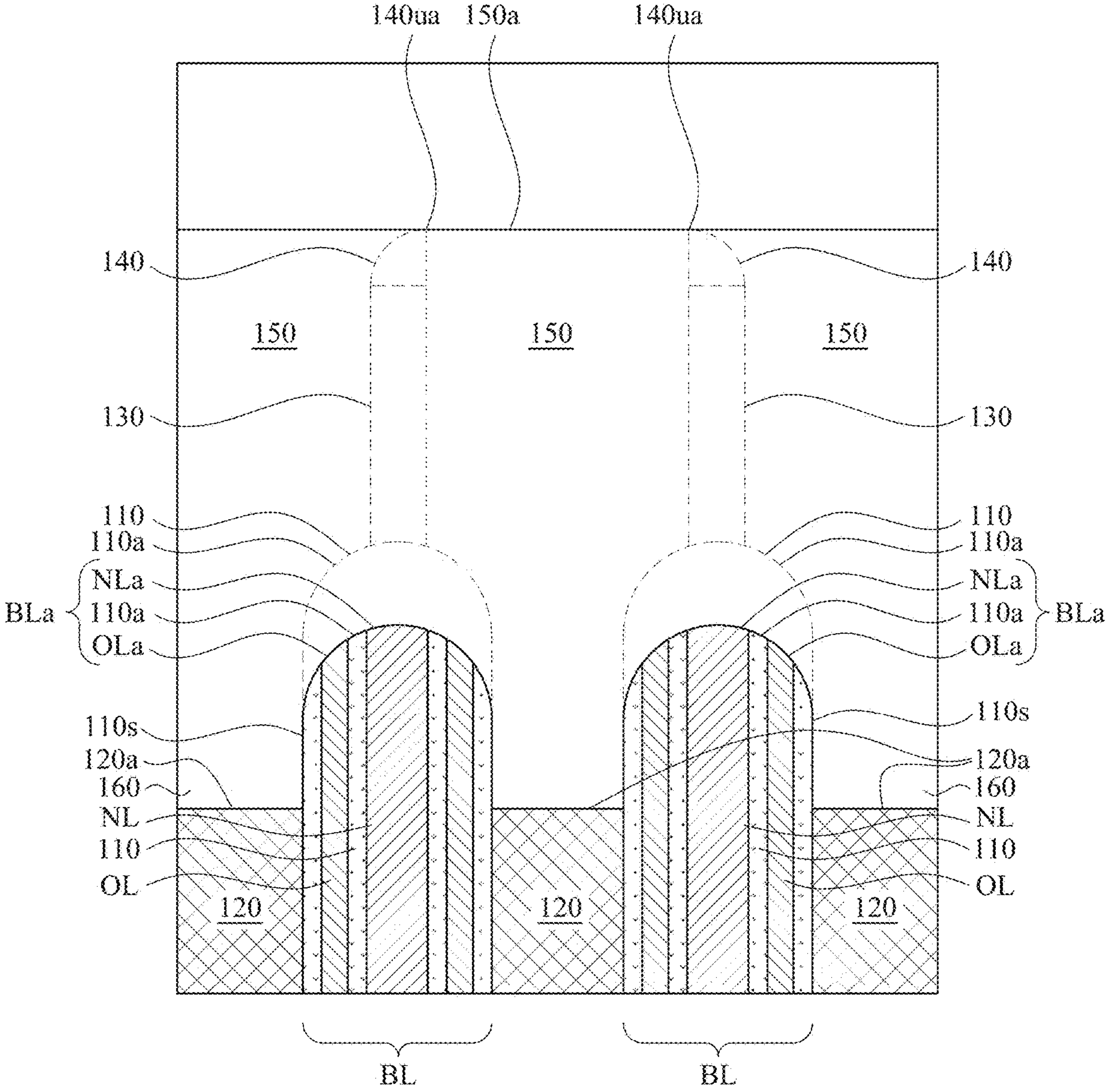
FIG. 4 is a cross-sectional view of an intermediate stage of manufacturing the semiconductor device in accordance with an embodiment of present disclosure.

In step S103, portions of the filling material 150, the contact layer 120, the nitride portions 110, the nitride layer NL, and the oxide layer OL are removed, as shown in FIG. 4.

Reference is made to FIG. 4. FIG. 4 is cross-sectional view of an intermediate stage of manufacturing the semiconductor device 100 in accordance with an embodiment of the present disclosure. As shown in FIG. 4, in this embodiment, the filling material 150, the contact layer 120, the nitride portions 110, the nitride layer NL, and the oxide layer OL are partly removed. The portions of the filling material 150, the contact layer 120, the nitride portions 110, the nitride layer NL, and the oxide layer OL are removed, so that the nitride layer NL and the oxide layer OL are exposed, as shown in FIG. 4. More specifically, a portion of the filling material 150 is removed in the back side, and another portion of the filling material 150, a portion of the contact layer 120, and a portion of the bit line structure BL are removed in the front side. As shown in FIG. 4, a portion of the nitride portions 110 located on the back side is covered by the filling material 150, so that the portion of the nitride portions 110 located on the back side is invisible.

As shown in FIG. 4, removing the portions of the filling material 150, the contact layer 120, the nitride portions 110, the nitride layer NL, and the oxide layer OL is performed such that a top surface 150*a* of the filling material 150 is coplanar with the uppermost surface 140*ua* of the patterned hardmask layer 140.

As shown in FIG. 4, removing the portions of the filling material 150, the contact layer 120, the nitride portions 110, the nitride layer NL, and the oxide layer OL is performed such that a remaining portion of the filling material 150 is not over the patterned hardmask layer 140.

As shown in FIG. 4, removing the portions of the filling material 150, the contact layer 120, the nitride portions 110, the nitride layer NL, and the oxide layer OL is performed such that the top surface 120*a* of the contact layer 120 is lower than a top surface BLa of the remaining portions of the bit line structure BL. The top surface BLa of the remaining portions of the bit line structure BL is substantially a top surface of the remaining portions of the nitride portions 110, the nitride layer NL, and the oxide layer OL. More specifically, the top surface BLa of the bit line structure BL consisting of a top surface 110*a* of the remaining portions of the nitride portions 110, a top surface NLa of the remaining portions of the nitride layer NL, and a top surface Ola of the remaining portions of the oxide layer OL, as shown in FIG. 4.

In some embodiments, the portions of the filling material 150, the contact layer 120, the nitride portions 110, the nitride layer NL, and the oxide layer OL may be removed by using any suitable material, for example, hydrofluoric acid (HF). The present disclosure is not intended to limit the methods of removing the portions of the filling material 150, the contact layer 120, the nitride portions 110, the nitride layer NL, and the oxide layer OL.

Figure 5:
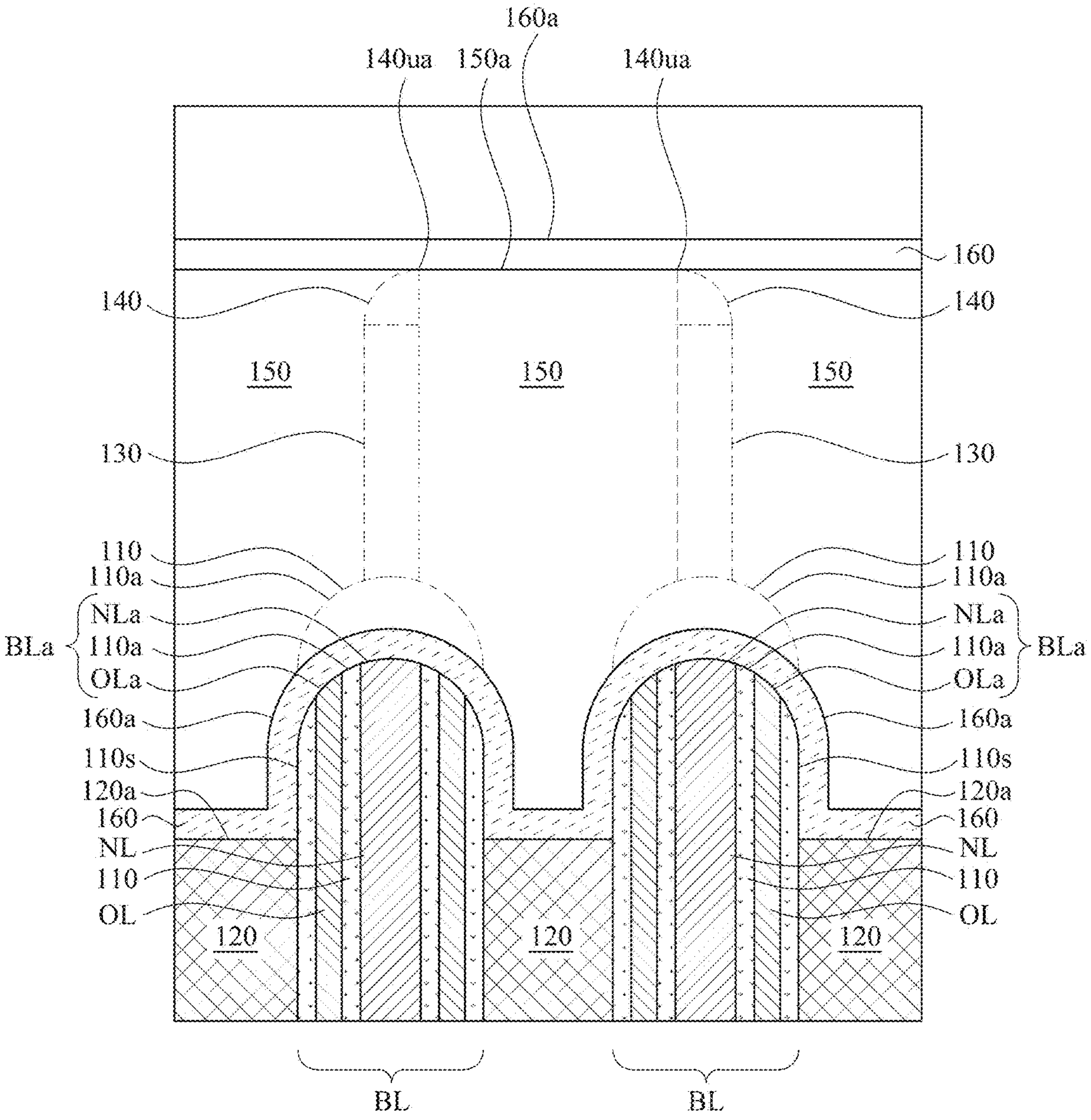
FIG. 5 is a cross-sectional view of an intermediate stage of manufacturing the semiconductor device in accordance with an embodiment of present disclosure.

In step S104, a blanket layer 160 is formed, as shown in FIG. 5.

Reference is made to FIG. 5. FIG. 5 is a cross-sectional view of an intermediate stage of manufacturing the semiconductor device 100 in accordance with an embodiment of the present disclosure. As shown in FIG. 5, in this embodiment, the blanket layer 160 is conformally formed on the filling material 150, the contact layer 120, and the remaining portions of the nitride portions 110, the nitride layer NL and the oxide layer OL. More specifically, the blanket layer 160 is disposed on the patterned hardmask layer 140 and the filling material 150 in the back side and disposed on the contact layer 120 and the remaining portions of the nitride portions 110, the nitride layer NL and the oxide layer OL in the front side.

As shown in FIG. 5, in some embodiments, at least a portion of the blanket layer 160 conforms to a top surface of the remaining portions of the nitride portions 110, the nitride layer NL, and the oxide layer OL. More specifically, at least the portion of the blanket layer 160 conforms to the top surface 110*a* of the nitride portions 110, the top surface NLa of the nitride layer NL, and the top surface OLa of the oxide layer OL.

In some embodiments, the blanket layer 160 may be spin-on dielectric. In some embodiments, the blanket layer 160 may include a material, such as titanium nitride (TiN), silicon nitride ($SiO_2$), or the like. However, any suitable material may be utilized.

In some embodiments, the blanket layer 160 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the blanket layer 160.

Figure 6:
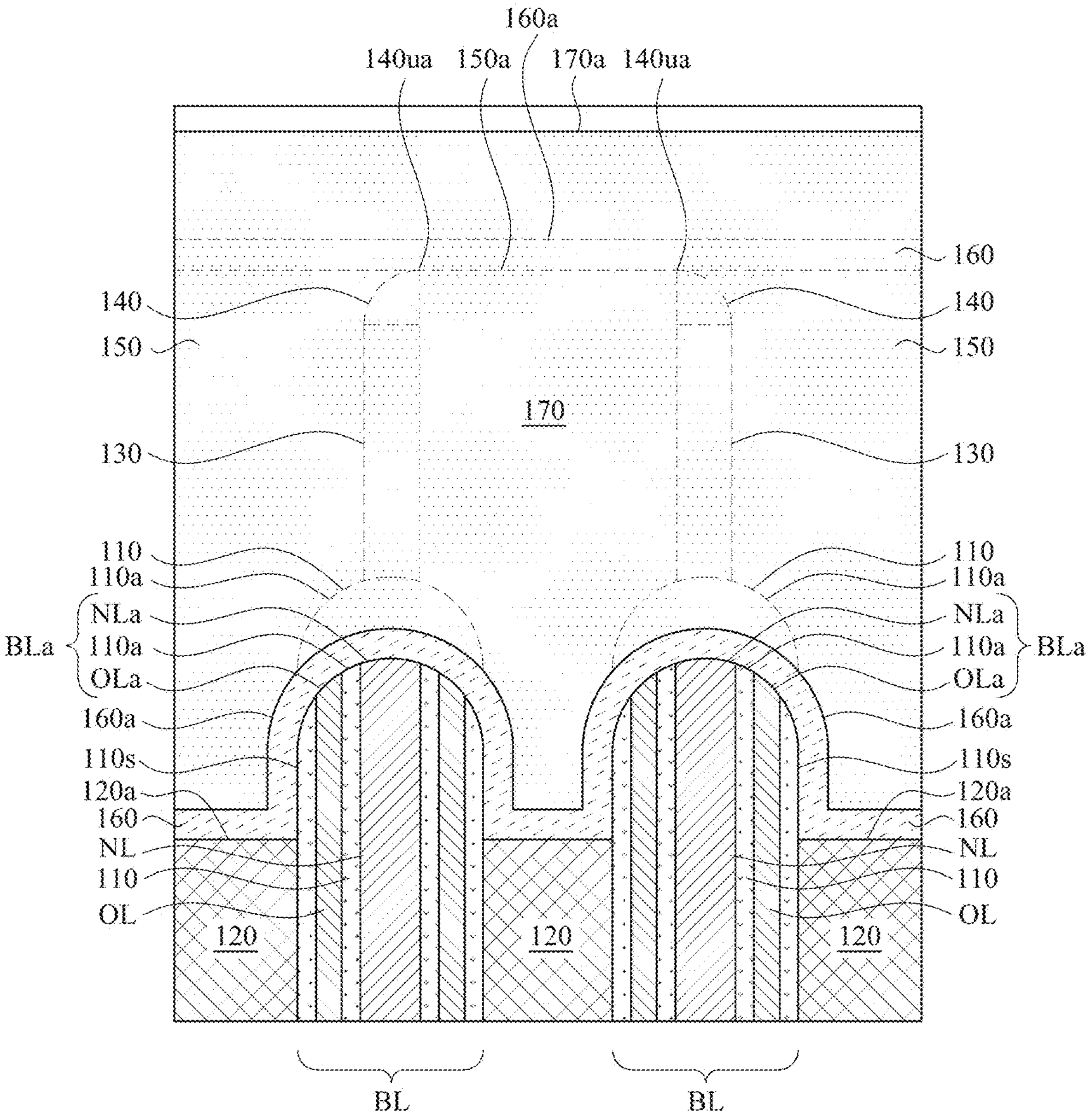
FIG. 6 is a cross-sectional view of an intermediate stage of manufacturing a semiconductor device in accordance with an embodiment of present disclosure.

In step S105, a conductive layer 170 is formed, as shown in FIG. 6.

Reference is made to FIG. 6. FIG. 6 is a cross-sectional view of an intermediate stage of manufacturing the semiconductor device 100 in accordance with an embodiment of the present disclosure. As shown in FIG. 6, in this embodiment, the conductive layer 170 is overfilled on the blanket layer 160. More specifically, the conductive layer 170 is disposed over the patterned hardmask layer 140, the filling material 150, and the blanket layer 160 in the back side and disposed over the contact layer 120, the bit line structure BL, and the blanket layer 160 in the front side.

As shown in FIG. 6, in some embodiments, the blanket layer 160 has a top surface 160*a* and the conductive layer 170 has a top surface 170*a*. In some embodiments, overfilling the conductive layer 170 on the blanket layer 160 is performed such that the top surface 170*a* of the conductive layer 170 is higher than the top surface 160*a* of the blanket layer 160 in both the back side and the front side.

As shown in FIG. 6, in some embodiments, overfilling the conductive layer 170 on the blanket layer 160 is performed such that the conductive layer 170 covers the spacer layer 130 and the patterned hardmask layer 140.

In some embodiments, the conductive layer 170 may be composed of metallic material. In some embodiments, the conductive layer 170 may include a material, such as tungsten (W), or the like. However, any suitable material may be utilized.

In some embodiments, the conductive layer 170 may be formed by any suitable method, for example, CVD (chemical vapor deposition), PECVD (plasma-enhanced chemical vapor deposition), PVD (physical vapor deposition), ALD (atomic layer deposition), PEALD (plasma-enhanced atomic layer deposition), ECP (electrochemical plating), electroless plating, or the like. The present disclosure is not intended to limit the methods of forming the conductive layer 170.

Figure 7:
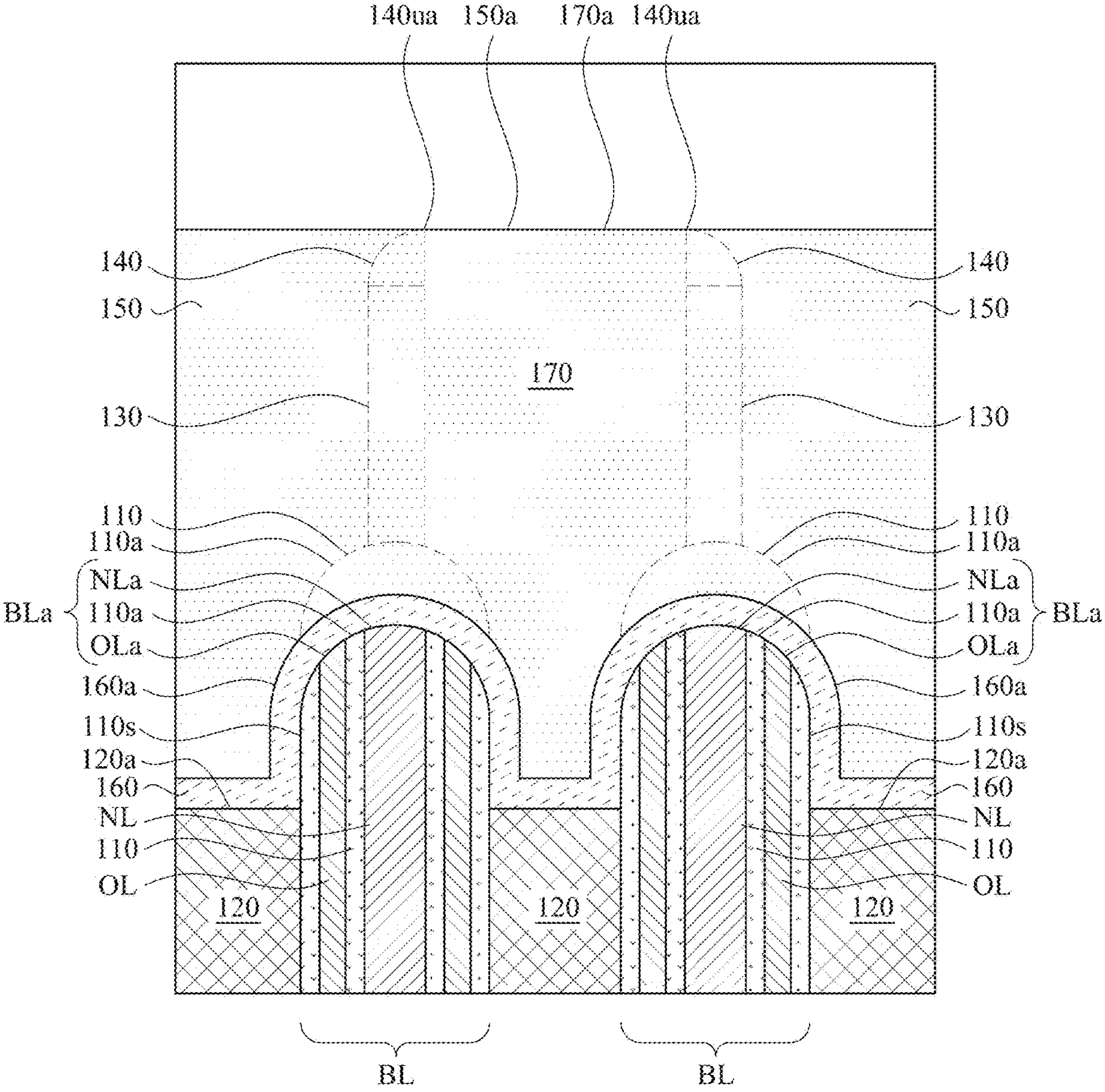
FIG. 7 is a cross-sectional view of an intermediate stage of manufacturing a semiconductor device in accordance with an embodiment of present disclosure.
Figure 8:
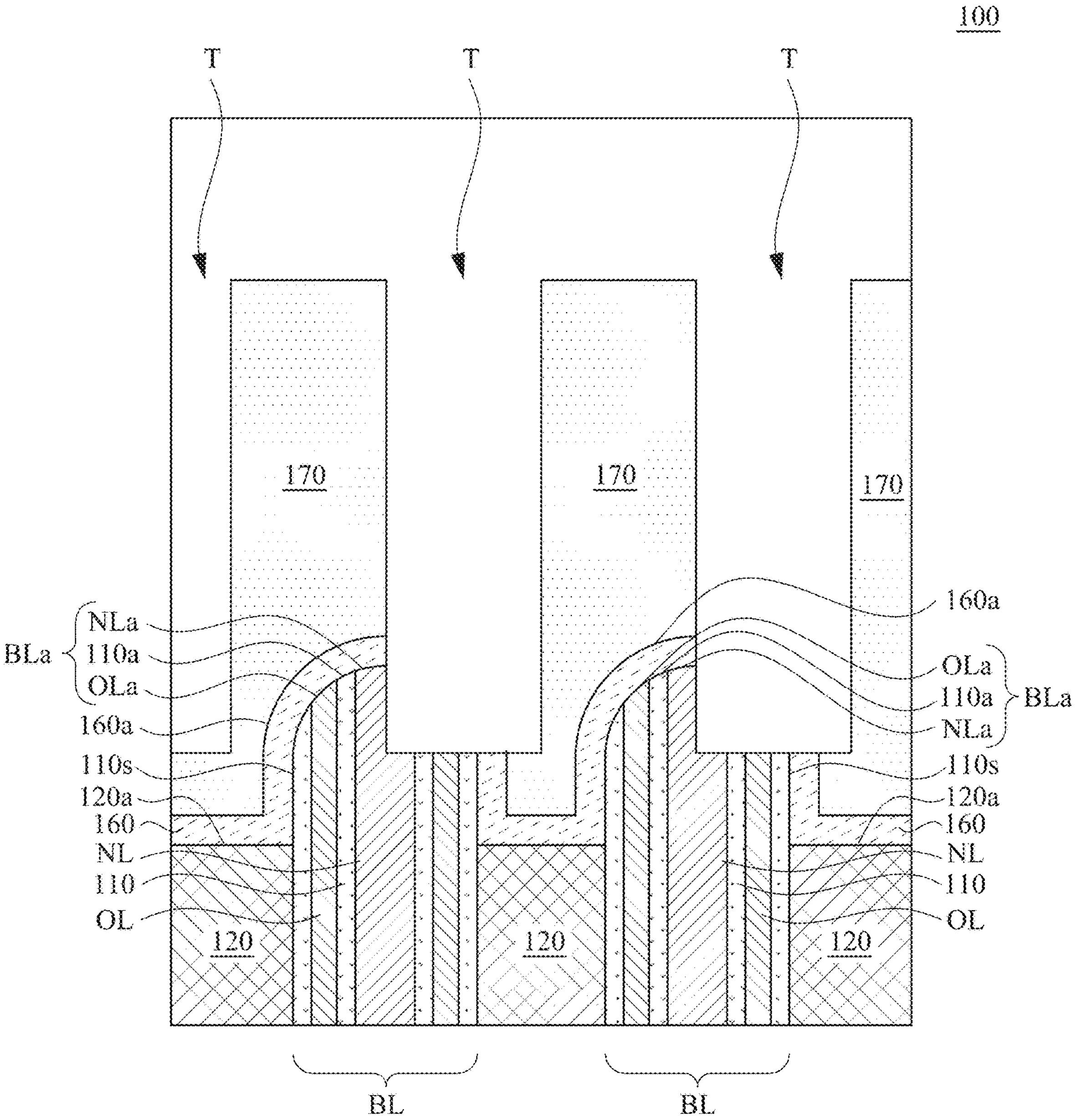
FIG. 8 is a cross-sectional view of an intermediate stage of manufacturing a semiconductor device in accordance with an embodiment of present disclosure.

In step S106, the conductive layer 170 is planarized, as shown in FIG. 7.

Reference is made to FIG. 7. FIG. 7 is a cross-sectional view of an intermediate stage of manufacturing the semiconductor device 100 in accordance with an embodiment of the present disclosure. As shown in FIG. 7, in this embodiment, the conductive layer 170 is planarized so that the conductive layer 170 is leveled with the uppermost surface 140*ua* of the patterned hardmask layer 140. More specifically, the conductive layer 170 is etched back so that the conductive layer 170 is leveled with the uppermost surface 140*ua* of the patterned hardmask layer 140 in the back side and located over the bit line structure BL with the rounding shape on top in the front side. As shown in FIG. 7, the conductive layer 170 is planarized and stopped by the patterned hardmask layer 140. Hence, the patterned hardmask layer 140 is configured as an etch stop layer of the semiconductor device 100. In some embodiments, the conductive layer 170 in the back side is sacrificial, so that the top surface 150*a* of the filling material 150 is coplanar with the uppermost surface 140*ua* of the patterned hardmask layer 140 in the back side.

In some embodiments, the conductive layer 170 may be planarized by using chemical-mechanical planarization (CMP) process or other suitable method.

In step S107, a trench T is formed, as shown in FIG. 8.

Reference is made to FIG. 8. FIG. 8 is a cross-sectional view of an intermediate stage of manufacturing the semiconductor device 100 in accordance with an embodiment of the present disclosure. As shown in FIG. 8, in this embodiment, the trench T is formed to remove portions of the conductive layer 170, the blanket layer 160, the nitride portions 110, the nitride layer NL, and the oxide layer OL, such that the semiconductor device 100 is formed. More specifically, the trench T is formed so that portions of the conductive layer 170, the blanket layer 160, the nitride portions 110, the nitride layer NL, and the oxide layer OL are removed in both the back side and the front side. As shown in FIG. 8, the trench T is formed such that a part of a top portion of the bit line structure BL and a portion of the blanket layer 160 are removed. The rounding shape is preserved in a bottom portion of the conductive layer 170, so that the conductive layer 170 has an enlarged volume than that of the conventional one.

As shown in FIG. 8, in some embodiments, the conductive layer 170 is configured as a CC plug and a landing pad located over the bit line structure BL.

As shown in FIG. 8, in some embodiments, forming the trench T to remove the portions of the conductive layer 170, the blanket layer 160, the nitride portions 110, the nitride layer NL, and the oxide layer OL is performed such that a part of a top portion of the blanket layer 160, the nitride portions 110, the nitride layer NL, and the oxide layer OL is removed.

In some embodiments, the trenches T may be formed by any suitable method, for example, isotropic etching, anisotropic etching, or the like. The present disclosure is not intended to limit the methods of forming the trench T.

In some embodiments, the trenches T may be formed by any suitable method, for example, wet etching, dry etching, or the like. The present disclosure is not intended to limit the methods of forming the trench T.

By performing the method M shown in FIG. 1 of the present disclosure, the conductive layer 170 finally may be formed with the rounding shape in its bottom portion, thereby reducing the resistance of the semiconductor device 100. Therefore, the semiconductor device 100 with better electrical performance may be formed.

Based on the above discussions, it can be seen that in the method of manufacturing the semiconductor device of the present disclosure, since the patterned hardmask layer is provided before the step of forming the filling material on the contact layer and covering the nitride portions, the spacer layer, and the patterned hardmask layer, the semiconductor device can be formed without damaging the rounding shape of the top surface of the remaining portions of the nitride portions, the nitride layer, and the oxide layer, thereby reducing the quantity of masks to form the conductive material. In the method of manufacturing the semiconductor device of the present disclosure, since the top surface of the filling material is higher than the uppermost surface of the patterned hardmask layer in the step of forming the filling material on the contact layer and covering the nitride portions, the spacer layer, and the patterned hardmask layer, the rounding shape of the top surface of the remaining portions of the nitride portions, the nitride layer, and the oxide layer can be formed, thereby defining a bottom portion of the conductive portion with enlarged volume. The method of manufacturing the semiconductor device improves the overall electrical performance of the entire semiconductor device.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of manufacturing a semiconductor device, comprising:

providing a semiconductor structure, wherein the semiconductor structure comprises nitride portions wrapping a nitride layer and an oxide layer, a contact layer between the nitride portions, a spacer layer disposed on the nitride portions, and a patterned hardmask layer on the spacer layer;

forming a filling material on the contact layer and covering the nitride portions, the spacer layer, and the patterned hardmask layer;

removing portions of the filling material, the contact layer, the nitride portions, the nitride layer, and the oxide layer, wherein a top surface of remaining portions of the nitride portions, the nitride layer, and the oxide layer has a rounding shape;

conformally forming a blanket layer on the filling material, the contact layer, and the remaining portions of the nitride portions, the nitride layer, and the oxide layer;

overfilling a conductive layer on the blanket layer;

planarizing the conductive layer so that a top surface of the conductive layer is leveled with an uppermost surface of the patterned hardmask layer; and forming a trench to remove portions of the conductive layer, the blanket layer, the nitride portions, the nitride layer, and the oxide layer.

2. The method of claim 1, wherein each of the nitride portions wrapping the nitride layer and the oxide layer, the nitride layer, and the oxide layer form a bit line structure.

3. The method of claim 1, wherein forming the filling material on the contact layer and covering the nitride portions, the spacer layer, and the patterned hardmask layer is performed such that a top surface of the filling material is higher than the uppermost surface of the patterned hardmask layer.

4. The method of claim 1, wherein removing the portions of the filling material, the contact layer, the nitride portions, the nitride layer, and the oxide layer is performed such that a top surface of the filling material is coplanar with the uppermost surface of the patterned hardmask layer.

5. The method of claim 1, wherein removing the portions of the filling material, the contact layer, the nitride portions, the nitride layer, and the oxide layer is performed such that a remaining portion of the filling material is not over the patterned hardmask layer.

6. The method of claim 1, wherein removing the portions of the filling material, the contact layer, the nitride portions, the nitride layer, and the oxide layer is performed such that a top surface of the contact layer is lower than the top surface of the remaining portions of the nitride portions, the nitride layer, and the oxide layer.

7. The method of claim 1, wherein at least a portion of the blanket layer conforms to the top surface of the remaining portions of the nitride portions, the nitride layer, and the oxide layer.

8. The method of claim 1, wherein overfilling the conductive layer on the blanket layer is performed such that the conductive layer covers the spacer layer and the patterned hardmask layer.

9. The method of claim 1, wherein planarizing the conductive layer is performed such that a portion of the blanket layer over the spacer layer and the patterned hardmask layer is removed.

10. The method of claim 1, wherein forming the trench to remove the portions of the conductive layer, the blanket layer, the nitride portions, the nitride layer, and the oxide layer is performed such that a part of a top portion of the blanket layer, the nitride portions, the nitride layer, and the oxide layer is removed.

11. A method of manufacturing a semiconductor device, comprising:

providing a semiconductor structure, wherein the semiconductor structure comprises nitride portions wrapping a nitride layer and an oxide layer, a contact layer between the nitride portions, a spacer layer disposed on the nitride portions, and a patterned hardmask layer on the spacer layer;

forming a filling material on the contact layer and covering the nitride portions, the spacer layer, and the patterned hardmask layer;

removing portions of the filling material, the contact layer, the nitride portions, the nitride layer, and the oxide layer, wherein a top surface of remaining portions of the nitride portions, the nitride layer, and the oxide layer has a rounding shape;

conformally forming a blanket layer on the filling material, the contact layer, and the remaining portions of the nitride portions, the nitride layer, and the oxide layer;

overfilling a conductive layer on the blanket layer;

planarizing the conductive layer and stopped by the patterned hardmask layer; and forming a trench to remove portions of the conductive layer, the blanket layer, the nitride portions, the nitride layer, and the oxide layer.

12. The method of claim 11, wherein each of the nitride portions wrapping the nitride layer and the oxide layer, the nitride layer, and the oxide layer form a bit line structure.

13. The method of claim 11, wherein forming the filling material on the contact layer and covering the nitride portions, the spacer layer, and the patterned hardmask layer is performed such that a top surface of the filling material is higher than an uppermost surface of the patterned hardmask layer.

14. The method of claim 11, wherein removing the portions of the filling material, the contact layer, the nitride portions, the nitride layer, and the oxide layer is performed such that a top surface of the filling material is coplanar with an uppermost surface of the patterned hardmask layer.

15. The method of claim 11, wherein removing the portions of the filling material, the contact layer, the nitride portions, the nitride layer, and the oxide layer is performed such that a remaining portion of the filling material is not over the patterned hardmask layer.

16. The method of claim 11, wherein removing the portions of the filling material, the contact layer, the nitride portions, the nitride layer, and the oxide layer is performed such that a top surface of the contact layer is lower than the top surface of the remaining portions of the nitride portions, the nitride layer, and the oxide layer.

17. The method of claim 11, wherein at least a portion of the blanket layer conforms to the top surface of the remaining portions of the nitride portions, the nitride layer, and the oxide layer.

18. The method of claim 11, wherein overfilling the conductive layer on the blanket layer is performed such that the conductive layer covers the spacer layer and the patterned hardmask layer.

19. The method of claim 11, wherein planarizing the conductive layer and stopped by the patterned hardmask layer is performed such that a portion of the blanket layer over the spacer layer and the patterned hardmask layer is removed.

20. The method of claim 11, wherein forming the trench to remove the portions of the conductive layer, the blanket layer, the nitride portions, the nitride layer, and the oxide layer is performed such that a part of a top portion of the blanket layer, the nitride portions, the nitride layer, and the oxide layer is removed.

* * * * *